United States Patent [19]

Ondris

[11] Patent Number: 5,026,980
[45] Date of Patent: Jun. 25, 1991

[54] LIGHT BIASED PHOTORESPONSIVE ARRAY HAVING LOW CONDUCTIVITY REGIONS SEPARATING INDIVIDUAL CELLS

[75] Inventor: Miroslav Ondris, Chagrin Falls, Ohio

[73] Assignee: OIS Optical Imaging Systems, Inc., Troy, Mich.

[21] Appl. No.: 470,256

[22] Filed: Jan. 25, 1990

Related U.S. Application Data

[60] Division of Ser. No. 339,063, Apr. 17, 1989, which is a continuation-in-part of Ser. No. 224,841, Jul. 26, 1988, which is a division of Ser. No. 40,532, Apr. 17, 1987, Pat. No. 4,785,191.

[51] Int. Cl.$^5$ ............................................ H01J 40/14
[52] U.S. Cl. ............................... 250/208.1; 358/213.15
[58] Field of Search .................. 250/208.1; 357/30 D, 357/30 G, 30 H; 358/213.15

[56] References Cited

U.S. PATENT DOCUMENTS

| | | | |
|---|---|---|---|
| 4,754,152 | 6/1985 | Hayama et al. | 250/208.1 |
| 4,827,117 | 5/1989 | Uchida et al. | 250/208.1 |
| 4,874,957 | 10/1989 | Sasaki et al. | 250/208.1 |

Primary Examiner—David C. Nelms
Assistant Examiner—Khaled Shami
Attorney, Agent, or Firm—Kenneth M. Massaroni

[57] ABSTRACT

A high density planar array of substrate-supported, thin film diodes constituting photoresponsive semiconductor elements is placed between a document to be read and a light source for illuminating the document. The document is illuminated by the light source via windows in the array, reflected light from the document impinging on the photoresponsive elements constituted by the diodes which are electronically interrogated to provide a signal which is indicative of image information on the document. The light source directly illuminates small portions of each diode to establish a discharge or bias current that makes the array more sensitive and responsive. The high density diodes of the array can be formed in a manner that minimizes leakage current between adjacent diodes.

2 Claims, 5 Drawing Sheets

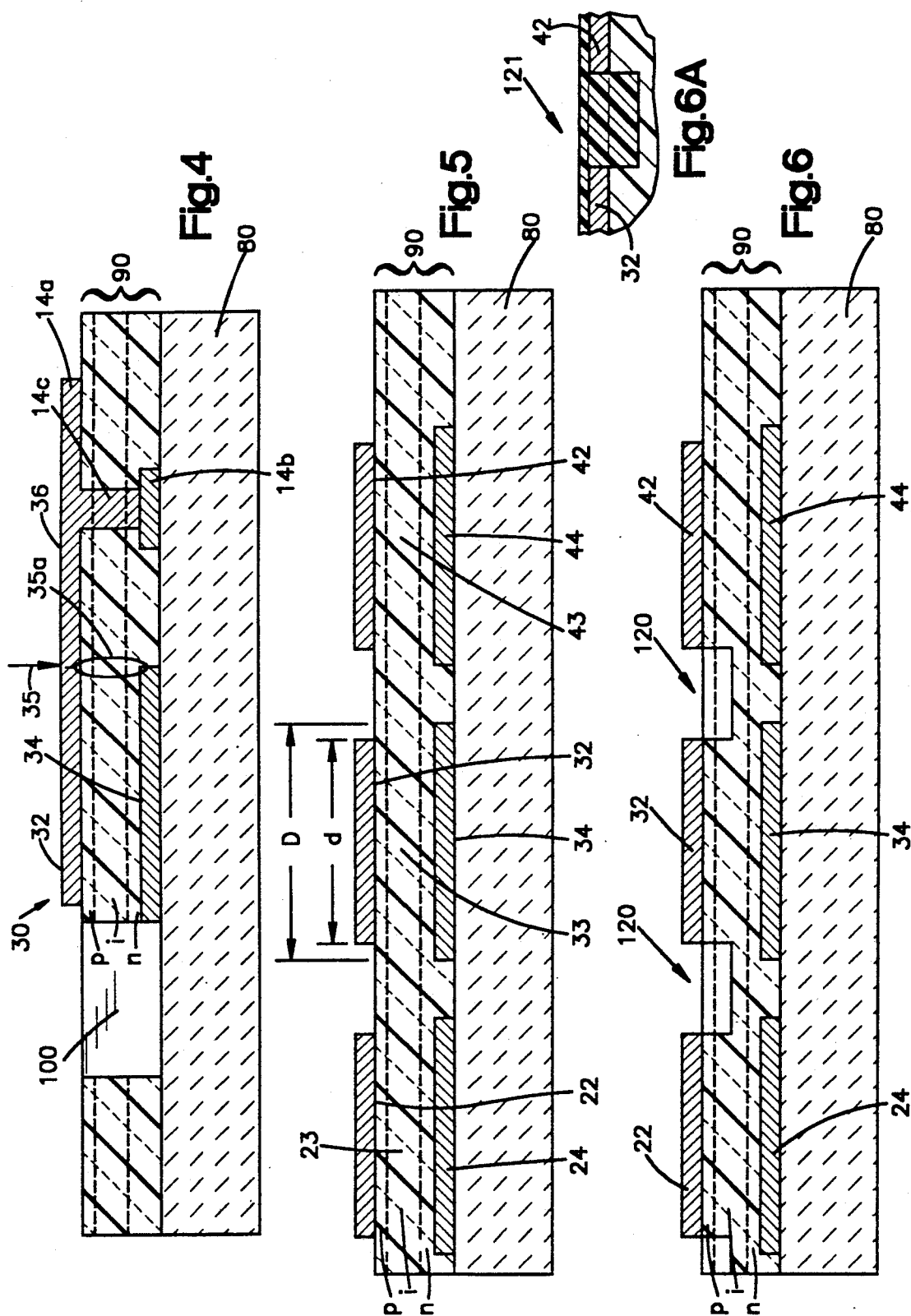

LIGHT BIASED PHOTORESPONSIVE ARRAY HAVING LOW CONDUCTIVITY REGIONS SEPARATING INDIVIDUAL CELLS

This application is a division of application Ser. No. 07/339,063, filed Apr. 17, 1989, which is a continuation-in-part application of copending U.S. patent application Ser. No. 224,841 filed July 26, 1988, which is a divisional application of U.S. patent application Ser. No. 40,532 filed Apr. 17, 1987, now U.S. Pat. No. 4,785,191. Pending U.S. patent application Ser. No. 224,841 and U.S. Pat. No. 4,785,191, both owned by the assignee of the present application, are incorporated by reference herein in their entireties.

BACKGROUND OF THE INVENTION

This invention relates in general to a photoresponsive array of semiconductor elements for electronically detecting or reading light contrasting images provided by a medium such as a document. More specifically, the present invention is directed to improving the performance of a high density photodiode array of the thin film type that is placed between a document to be read or scanned by the array and a light source for illuminating the document.

Light from the light source passes through transparent window areas in the array and impinges on the document which is in close proximity to or in contact with the array. The reflected light from the document illuminates the photodiodes of the array, which are then electronically interrogated or read during a scan to provide a signal indicative of the images on the document. The spatial density of the photodiodes determines the optical resolution of the array, each diode constituting a pixel element. The array can be in the form of a line scanner or a full page scanner.

Such arrays are generally known in the art as thin film backlit arrays which rely on proximity focusing, i.e., the reflected light from the document being read impinges on the photodiodes of the array without passing through any focusing elements such as collimators, lenses or the like.

U.S. Pat. Nos. 4,149,197 and 4,660,095 illustrate thin film, backlit arrays of the proximity focusing type wherein the respective inventors teach that the photoresponsive elements or light sensors of their respective arrays must be shielded from direct impingement by light from the light source in order to avoid light saturation of the associated light sensors.

SUMMARY OF THE INVENTION

In accordance with the present invention, a substrate is provided and supports an array of photoresponsive semiconductor elements. The array is positionable adjacent to a medium presenting light contrasting images to be read by the array. Light from an illumination source is projected, e.g., reflected from or transmitted through, the medium onto the semiconductor elements. The semiconductor elements are then electronically read during a scan to provide an electrical signal indicative of the images presented by the medium. Improved performance of the array is provided by directing some of the light from the illumination source directly onto a limited portion of each photoresponsive semiconductor element to generate a current for discharging any residual charges on the semiconductor elements (e.g., caused by parasitic capacitance) before the next scan. This current can also constitute a reference or bias part of the electrical signal provided by the array as it is read. Such a feature provides a more sensitive and responsive array as compared to those of the prior art.

Preferably the semiconductor elements are thin film photodiodes and the reference part of the signal is a discharge or bias current generated by the photodiodes in response to being directly illuminated by light from the light source not affected by the medium. The medium can be in the form of a printed document, for example, that is to be photocopied or transmitted by facsimile. The substrate can be generally planar, thus providing two sides, the photodiodes being carried on one side of the substrate. Each photodiode has an upper surface upon which impinges light reflected or transmitted through the medium or document. Remaining surfaces of the diode provide the limited portion upon which directly impinges light from the light source that has not been affected by the medium or document, i.e., not affected by the light contrasting images to be read.

In the embodiment of the invention illustrated herein, the array is positionable adjacent to the medium or document, the array including at least one window area through which light from the illumination source passes. The light passes through one or more window areas and is reflected from the medium or document onto the photodiode elements. The substrate of the array can be a transparent piece of glass having an underside adjacent to the illumination source and an upper side carrying the photodiode elements which are preferably monolithically formed on the substrate. The medium or document is placed in close proximity to or on the upper surface of the array. A small portion of the light is transmitted through the transparent substrate directly into the active region of the diodes to establish the above-noted discharge or bias current.

In further accordance with the present invention, the photodiodes, which are closely spaced together (on the order of 10 microns) to provide the desired optical or pixel density, are electrically isolated from each other to a degree to minimize inter-diode leakage currents or cross talk by removing some semiconductor material between adjacent diodes. The removed semiconductor material can be replaced by a less electrically conductive material if desired.

Arrays provided in accordance with the present invention, while simple in design and manufacturing process, have been found to be especially useful in providing fast response, high definition arrays for both black and white and gray scale indicative image detection.

BRIEF DESCRIPTION OF THE DRAWINGS

A fuller understanding of the invention may be had by referring to the following description and claims taken in conjunction with the accompanying drawings, wherein:

FIGS. 4 and 5 are cross section views of portions of FIG. 2 taken along lines 4—4 and 5—5, respectively;

FIGS. 6 and 6A illustrate alternatives or modifications to the array structure illustrated in FIG. 5.

DETAILED DESCRIPTION OF THE PREFERRED EMBODIMENTS

Figure 1:
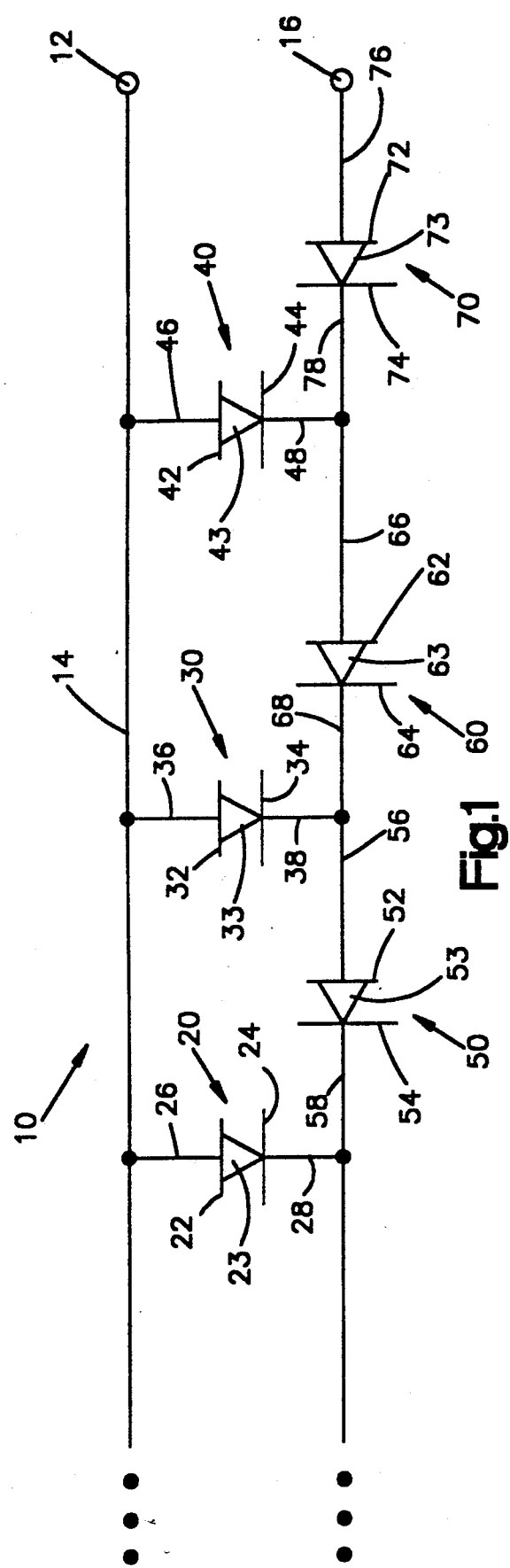
FIG. 1 is a schematic representation of a portion of a photoresponsive array in accordance with the present invention.

FIG. 1 schematically illustrates a portion of a photoresponsive array 10 which includes a plurality of photoresponsive semiconductor elements, namely first, second and third photodiodes 20, 30, 40. The array 10 also includes another plurality of non-photoresponsive semiconductor elements, namely first, second and third non-photoresponsive or conventional diodes 50, 60, 70.

The photodiodes 20, 30, 40 each have respective anode electrodes 22, 32, 42 and cathode electrodes 24, 34, 44 between which is sandwiched semiconductor material 23, 33, 43 constituting the active regions of the photodiodes. Appropriate anode leads 26, 36, 46 and cathode leads 28, 38, 48 are provided for electrically connecting the photodiodes 20, 30, 40 to other circuit elements.

In a similar fashion, non-photoresponsive or conventional diodes 50, 60, 70 each have respective anode electrodes 52, 62, 72 and cathode electrodes 54, 64, 74 between which is sandwiched semiconductor material 53, 63, 73 constituting the active regions of the non-photoresponsive diodes. Each of the diodes 50, 60, 70 provides respective anode leads 56, 66, 76 and cathode leads 58, 68, 78 to permit electrical connection of the diodes 50, 60, 70 to other circuit elements.

The anode leads 26, 36, 46 of the photodiodes are electrically connected together via a bus bar 14 having an end constituting a first terminal 12 of the array. The non-photoresponsive diodes 50, 60, 70 are electrically connected in a series relationship with each other as illustrated. The cathode lead 48 of photodiode 40 is connected to the cathode lead 78 of non-photoresponsive diode 70 and to the anode lead 66 of diode 60, the anode lead 76 of diode 70 being connected to a second terminal 16 of the array. In a similar fashion, cathode lead 38 of photodiode 30 is electrically connected to cathode lead 68 and anode lead 56 of non-photoresponsive diodes 60 and 50, respectively. Similarly, the cathode lead 28 of photodiode 20 is electrically connected to cathode lead 50 of non-photoresponsive diode 50.

As will be recognized by those skilled in the art, the non-photoresponsive diodes 50, 60, 70 are electrically connected in like polarity series string circuit relationship wherein one end of the string is the second terminal 16 of the photoresponsive array portion. The photodiodes 20, 30, 40 are electrically connected to a different one of the electrical junctions between the non-photoresponsive diodes 50, 60, 70.

The degree of illumination of each photodiode 20, 30, 40 is determined by applying a ramp voltage signal to the array terminals 12, 16 and then observing the sequential current flows as the ramp voltage signal increases. The changes in current flow, indicating various degrees of illumination of the photodiodes, occur at ramp voltage signal points that correspond to the physical positions of the photodiodes as determined by their sequential conduction. From the current flows detected during application of the ramp signal, the desired illumination versus location information can be determined. In effect, the sequential breakover or forward conduction of non-photoresponsive diodes 50, 60, 70 determines the location of the photodiodes 20, 30, 40. The degree of current conduction of the photodiodes 20, 30, 40 determines the level of light intensity illumination of the individual photodiodes 20, 30, 40 functioning as array pixel elements.

In accordance with the present invention, and contrary to the earlier discussed prior art, the photodiodes, 20, 30, 40 are partially illuminated, at least between scans, to establish a discharge current to accelerate the discharge of the diodes 20, 30, 40 between scans, such discharging overcoming the negative effects of the parasitic capacitance of the diodes 20, 30, 40. The discharge current can also function as a bias current level which provides in some applications for optimized light detecting sensitivity of the photodiodes, particularly in black and white, or "on" and "off" detection.

It is to be noted that while only three photodiode/-non-photodiode pairs are illustrated, in practice up to 32 diode pairs in a string of the type illustrated in FIG. 1 are provided. This is schematically illustrated by the dotted lines extending to the left of FIG. 1.

Figures 1A, 1B:
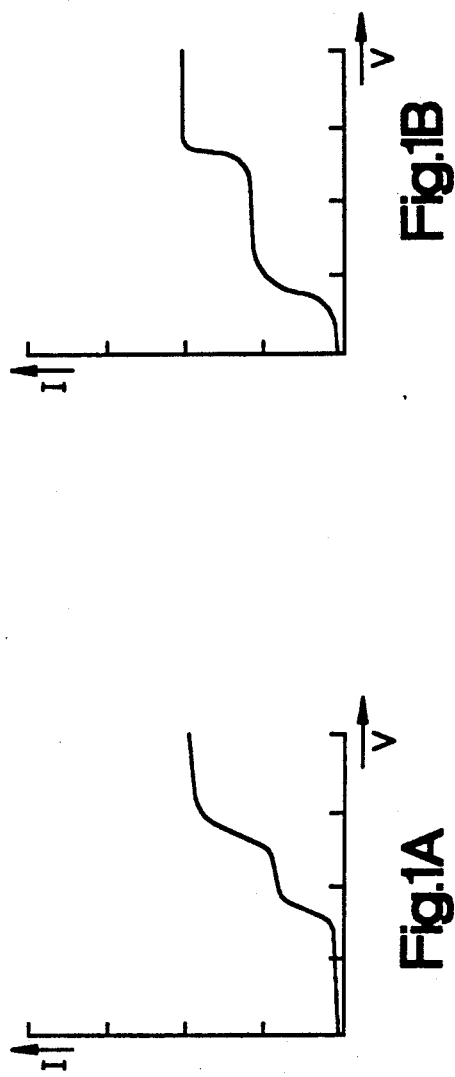
FIGS. 1A and 1B are graphical representations of possible output signals of the array portion illustrated in FIG. 1.

With reference to FIG. 1A, as an example of the response of the array portion of FIG. 1 to an interrogating voltage ramp signal, measured responses of the array portion incorporating the three discrete photodiodes 20, 30, 40 and three discrete non-photoresponsive diodes 50, 60, 70 measured on a curve tracer are shown in FIGS. 1A and 1B. The results are indicated with respect to the photodiode 40 which is least remote from the terminals 12, 16, the photodiode 30, next least remote from the network terminals, etc. In FIG. 1A, the photodiode 40 is not illuminated, while the other two photodiodes 30, 20 are illuminated. In FIG. 1B, only the photodiode 30 is not illuminated. Clearly, when a particular photodiode is illuminated, there is a current change within a voltage range that discloses the position and illuminated condition of the interrogated photodiode. The information thus gained can be electronically processed, stored, manipulated, and/or used to produce a desired result, e.g., an image on a page of paper, a display on a monitor, or stored data. The electronics may include a microprocessor to manipulate the information in a particular, preselected manner.

As already mentioned, the voltage at which a step increase in current occurs corresponds to a position along the array. The amount of the current increase corresponds to the light intensity at that position. In the absence of illumination, the step increase in current is very small, or non-existent. To improve array performance in accordance with one aspect of the present invention as noted above, each photoresponsive diode is directly illuminated at an intensity that is below the lowest intensity signal intended to be detected. With that limited background illumination, a small bias current step will be present at each photoresponsive diode in the array. That position information consists in confirming the presence or absence of a detected signal at each photoresponsive diode in the array, as well as avoiding any undesirable residual charge storage effects (caused, for example, by parasitic capacitance of the diodes) that could reduce the response or speed of the array, i.e., the bias current also functions as a discharge current to accelerate the discharge of the photodiodes between scans, as noted above.

A more detailed discussion of the electrical operation and of alternative embodiments to the schematically illustrated array portion of FIG. 1 are set forth in heretofore incorporated U.S. Pat. No. 4,785,191 issued to the inventor of the present application.

Figure 2:
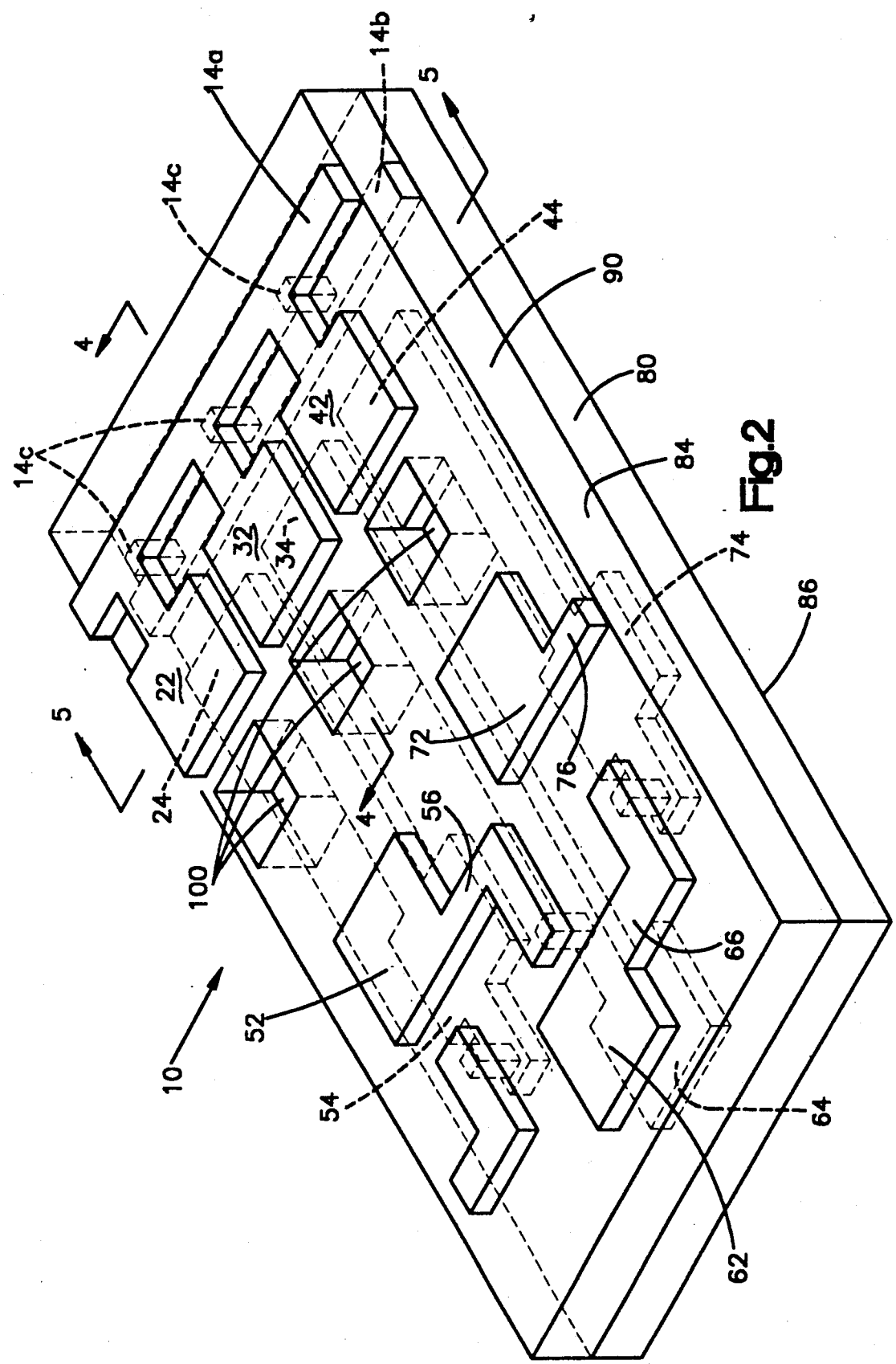
FIG. 2 is a non-scale, perspective view of the physical structure of the array portion schematically illustrated in FIG. 1.

FIG. 2 illustrates in perspective view that portion of the photoresponsive array 10 schematically illustrated in FIG. 1. In FIG. 2, the reference numerals of FIG. 1 have been provided to identify corresponding structural components of an actual photoresponsive array portion in accordance with the present invention. In a similar fashion, FIG. 3 is an exploded view of FIG. 2, and also provides reference numerals corresponding to those of FIGS. 1 and 2.

Figure 3:
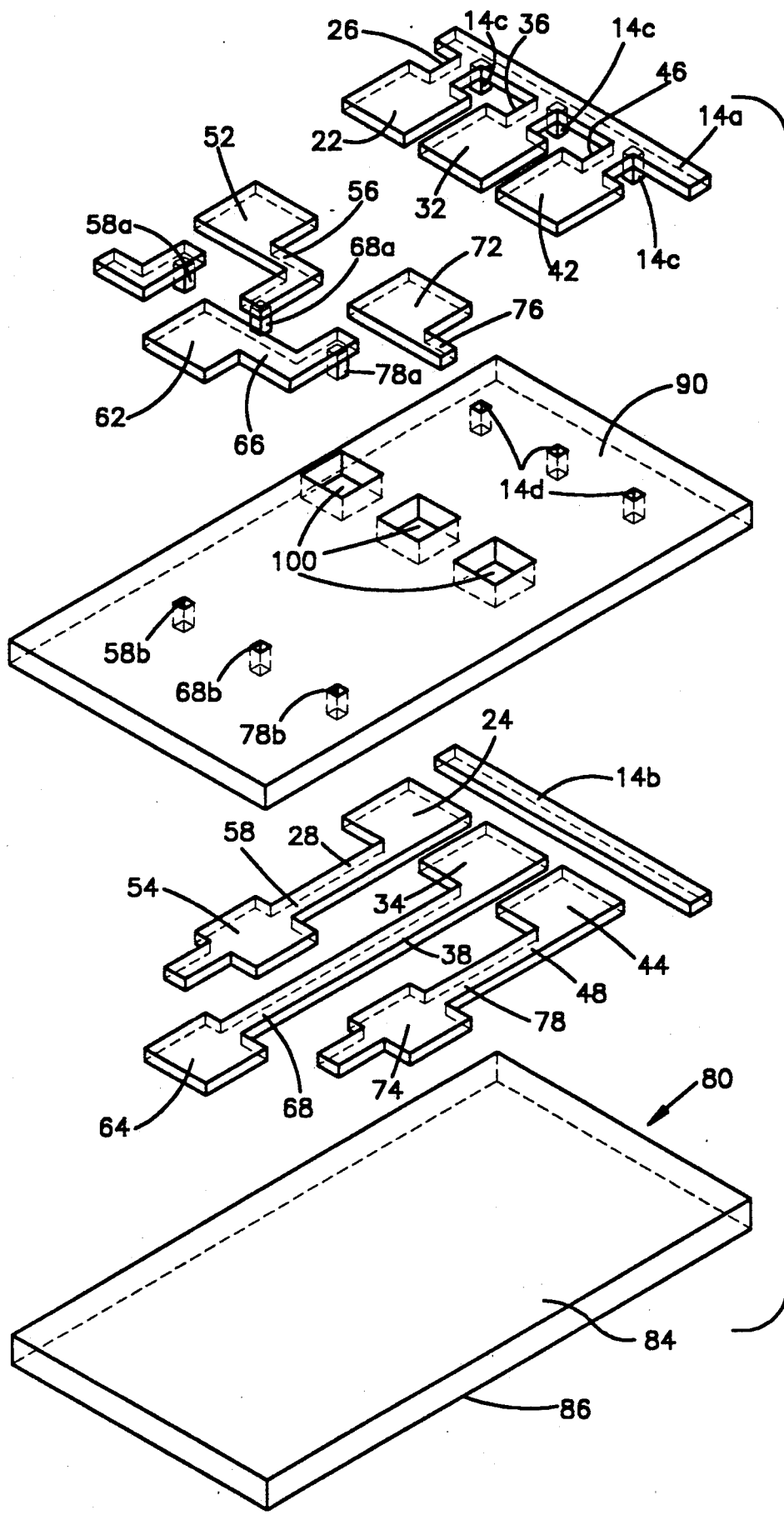
FIG. 3 is an exploded view of the array portion illustrated in FIG. 2.

With reference to FIGS. 2 and 3, which are not to scale, the array portion 10 includes a generally planar substrate 80 having an upper surface or side 84 and a lower surface or side 86, as illustrated. Preferably, the substrate is formed from electrically non-conductive, light transparent material such as plate glass of high optical quality having a thickness of, for example, one millimeter. The term "transparent" in the context of the present invention means that the substrate 80 is preferably transparent to the wavelength of the light or other electromagnetic radiation being detected, whether visible or non-visible, such as infrared, for example.

The photoresponsive elements or sensors of the array, and related interconnecting leads, are monolithically formed on the upper side 84 of the substrate 80. Such formation can be provided by use of conventional photolithography and material deposition tecniques, such as electrodepositing and vapor deposition, to provide thin film semiconductor elements, as is well known in the art.

With specific reference to FIG. 3, a lower layer or cathode level of electrically conductive material includes the cathode electrodes 24, 34, 44 in the form of generally square, rectangular pads, as illustrated. Extending from the pads are respective cathode leads 28, 38, 48 which extend to meet associated cathode leads 58, 68, 78 of the non-photoresponsive diodes 50, 60, 70 discussed earlier in reference to FIG. 1. The cathode leads 58, 68, 78 extend to their respective cathode electrodes 54, 64, 74, which are also formed in the shape of generally square, rectangular pads. Also provided along the top edge (as illustrated in FIG. 3) of the substrate 80, on the top surface 84 thereof, is a lower bus bar portion 14b constituting a part of bus bar 14 schematically illustrated in FIG. 1. The gridlike electrode and lead elements thus far discussed, constituting the lower layer or level of the photoresponsive sensor or array structure, are preferably formed of an electrically conductive, vapor deposited metal, such as molybdenum, chromium, or aluminum, which is substantially opaque to light, for reasons to be subsequently discussed. The thickness of the elements of the metal layer is typically a thousand to a few thousand (e.g., 1000–3000) angstroms. Other light-opaque, electrically conductive materials could also be used.

With the lower layer elements deposited in place in a prescribed pattern as illustrated on the upper surface 84 of the substrate 80, a middle layer or level of light-opaque semiconductor material 90, preferably amorphous or polycrystalline silicon, or other thin film semiconductor material, is deposited onto the upper side 84 of the substrate so as to cover the lower level elements, i.e., lower bus bar portion 14b, cathode electrodes 24, 34, 44, cathode electrodes 54, 64, 74 and their various interconnecting leads. The thickness of the semiconductor layer is on the order of several hundred nanometers (e.g., 750) so as to attenuate light transmission therethrough wherein such layer 90 is generally opaque to light.

By using suitable selective chemical etching and photolithography techniques or the like, a plurality of generally square, rectangular window areas 100 are provided through the semiconductor material layer 90, as illustrated. Also, a plurality of interconnection apertures 14d are provided along the top end or edge of the semiconductor material layer 90. In a similar fashion, a plurality of interconnection apertures 68b, 78b and 76b are provided along the lower end or edge of the semiconductor layer 90.

In a further stage of forming a photoresponsive array in accordance with the invention, an upper layer or anode level of elements is deposited onto the etched semiconductor material layer 90 which overlies the lower layer or level of elements as discussed earlier. This upper level of array elements, having a thickness of about 1000 angstroms, for example, is formed from a light transparent, electrically conductive material such as vapor deposited indium tin oxide or the like. Such a transparent material is used to allow light to transmit therethrough and impinge on those portions of the semiconductor material layer 90 that are covered by such upper layer or cathode level elements. Such a layer also reduces undesired light reflection from the upper level of array elements. More particularly, the upper layer or anode level of elements includes an upper bus bar portion 14a which is connected to the lower bus bar portion 14b via a plurality of integral interconnects or bridge portions 14c extending through the interconnection apertures 14d, the bus bar portion 14a and bridge portions 14c being simultaneously formed of the same light transparent material. Extending from the upper bus bar portion 14a are the anode leads 26, 36, 46 of the photoresponsive diodes 20, 30, 40 (see FIG. 1). These leads 26, 36, 46 in turn extend to the anode electrodes 22, 32, 42 of the photodiodes. These anode electrodes 22, 32, 42 are centered over and above the cathode electrodes 24, 34, 44, and are of a square, rectangular shape geometrically identical to the earlier discussed cathode electrodes 24, 34, 44, but have, in accordance with the present invention, a smaller surface area dimension than such light-opaque cathode electrodes 24, 34, 44. The purpose of this difference in surface area will be discussed subsequently.

The upper level of elements also includes square, rectangle-shaped anode electrodes 52, 62, 72 forming part of the non-photoresponsive diodes 50, 60, 70 (see FIG. 1), the anode electrodes 52, 62, 72 being centered over and above their respective cathode electrodes 54, 64, 74. The anode electrodes 52, 62, 72 have related anode leads 56, 66, 76. Anode leads 56, 66 are connected to lower level elements of the array (i.e., cathode leads 68, 78) by respective interconnects or bridge portions 78a and 76a which extend through the interconnection aperture 78b and 76b, as illustrated most clearly in FIG. 3. Another interconnect or bridge portion 68a extends through aperture 68b to provide for the connection of leads 58 and 28 to an adjacent diode (not shown). It can be seen that the exploded structure of FIG. 3, shown in an assembled form in FIG. 2, electrically provides the circuit illustrated and discussed earlier with regard to FIG. 1. Diodes 50, 60, 70 are like polarity, series relationship with each other, while photodiodes 20, 30, 40 are electrically connected to appropriate inter-diode junctions in the string of non-photoresponsive diodes 50, 60, 70 as discussed earlier.

With particular reference to FIG. 2, as will be recognized by those in the art, the photoresponsive diodes or photodiodes 20, 30, 40 (see FIG. 1) are constituted by those portions of the semiconductor material layer 90 sandwiched between electrode pairs 22-24, 32-34, and 42-44. In a similar fashion, the non-photoresponsive or conventional diodes 50, 60, 70 (see FIG. 1) are constituted by those portions of the semiconductor layer 90 sandwiched between electrode pairs 52-54, 62-64, 72-74.

The photodiodes 20, 30, 40 are spaced closely together (approximately 10 microns apart) and aligned, each photodiode being adjacent to a window area 100 as illustrated. As will be illustrated in greater detail subsequently, light will shine through the transparent substrate 80 and then through the window areas 100 to impinge on an overlying light contrasting medium, such as a document, the light reflecting off the document and down into the active region of the diodes 20, 30, 40 via transparent anode electrodes 22, 32, 42. It should be noted that other window/diode configurations are contemplated. For example, two portions of one diode, e.g., along opposed sides of one window, could be provided. Also, annular or ringlike windows surrounding the associated diode could be provided. Multiple windows could also be provided for each diode.

By design, the non-photoresponsive diodes having active regions constituted by portions of the semiconductor layer 90 sandwiched between electrode pairs 52-54, 62-64, 72-74 are spaced far enough away from the window areas 100 so as not to be illuminated by light transmitted therethrough. It is contemplated that conventional light-opaque shielding could be provided to mask the non-photoresponsive diodes to the extent required. As noted earlier, generally light-opaque semiconductor material layer 90 is of a required thickness so that it in effect masks or shields an overlying document portion from illumination from a light source other than by light passing through the transparent substrate 80 via the window areas 100.

Turning to FIG. 4, a cross section view along line 4—4 of FIG. 2 is illustrated. In a similar fashion with reference to FIG. 5, a cross section view along line 5—5 of FIG. 2 is illustrated. As shown in FIG. 4, one of the window areas 100 is adjacent to an edge of its respective photodiode 30 constituted by its padlike anode electrode 32 and its padlike cathode electrode 34. The active region of the diode 30, i.e., that area of the semiconductor material layer 90 located only between the surface areas of electrodes 32, 34, is, for example in the form of a p-i-n diode structure. An n-i-p diode structure could also be used. The layer 90 can be sequentially deposited to provide a thin p-doped layer, a relatively thick intrinsic layer or i layer, and a thin n-doped layer, as illustrated. With reference to both FIGS. 4 and 5, and in accordance with the present invention, the dimensional surface area of the transparent anode electrode 32 is smaller than the surface area of the related cathode electrode 34. More specifically, the distance D constituting the width or length of the generally square, rectangular padlike cathode electrode 34 is greater than the distance d or width or length of the generally square, rectangular padlike anode electrode 32, as illustrated in both FIGS. 4 and 5. This is important so that the light-opaque cathode electrode 34 substantially shield the active peripheral region of the diode from the light being transmitted through the transparent substrate 80. It will be recognized that the smaller surface area of the electrode 32 generally defines the peripheral limits of the active region of the diode which are overlapped by the larger surface area cathode electrode 34. While the material of layer 90 has been termed "generally" light-opaque, it is recognized that light transmitted through the substrate 80 can to a limited degree penetrate the underside of the layer 90, and that this is an important feature of the invention, as will become apparent.

With further reference to FIG. 4, the anode lead 36 can be seen to extend from the anode electrode 32. It will be recognized that the anode lead 36 extends vertically over the lower edge of the larger cathode electrode 34 as illustrated by arrow 35. In other words, the surface area of the larger cathode electrode 34 extends horizontally beyond the surface area of the overlying anode electrode 32 but for the area where the anode lead 36 joins to the anode electrode 32. Thus, the active region of the diode 30 includes that small part of semiconductor material sandwiched between the leftward end of the anode lead 36 as illustrated in FIG. 4, and right edge of the cathode electrode 34, this small portion of the active area of the diode constituting the region indicated by circled area 35a. Similar regions are provided for diodes 20 and 40 and all other photodiodes in the array. This region 35a provides the earlier-noted discharge or bias current for the diode since it can, to a limited degree, be directly illuminated by an illumination source, as will be subsequently illustrated. Thus, as shown in FIG. 5, the lower electrodes 24, 34, 44 are of a larger surface area so as to substantially shield the active regions 23, 33, 43 defined by the smaller overlying and above centered anode electrodes 22, 32, 42, but for those regions directly between anode leads 26, 36, 46 and underlying cathode electrodes 24, 34, 44. It is contemplated that other electrode geometries such as circular, non-square, etc. could provide the features noted above. It is also contemplated that the non-photoresponsive diodes 50, 60, 70 may be formed with a geometry to provide the current biasing feature (like photoresponsive diodes 20, 30, 40), although this is not required.

A modification of the structure illustrated in FIG. 5 is shown in FIGS. 6 and 6a. To minimize leakage current or cross talk between adjacent diodes, the conductivity of the semiconductor material layer 90 is very closely controlled and is reduced to the lowest level practical. In cases where leakage currents or cross talk between the closely spaced, adjacent diodes illustrated in FIG. 5 are still at an undesirable level due to the close proximity (10 microns) of the diodes and due to the presence of the semiconductor material therebetween, linear recesses 120 can be provided (e.g., by etching) between the anode electrodes 22, 32, 42 so as to remove some of the semiconductor material layer 90 from between the diodes. In accordance with the present invention, such a feature inherently minimizes the flow of leakage currents between the diodes as will be appreciated by those skilled in the art. In further accordance with the present invention, a non-electrically conducting material 121 can be used to fill in the recesses 120 of FIG. 6 and can, if transparent, also be of a thickness to cover, as a thin protective layer, the top surfaces of the transparent anode electrodes 22, 32, 42 so that they do not come in direct contact with the light contrasting medium or document contiguous thereto that is being read. For example, a suitable material 121 (see FIG. 6A) could be silicon nitride, diamondlike-microcrystalline carbon or other abrasion-resistant, transparent material, as taught by U.S. Pat. No. 4,691,243.

Figure 7:
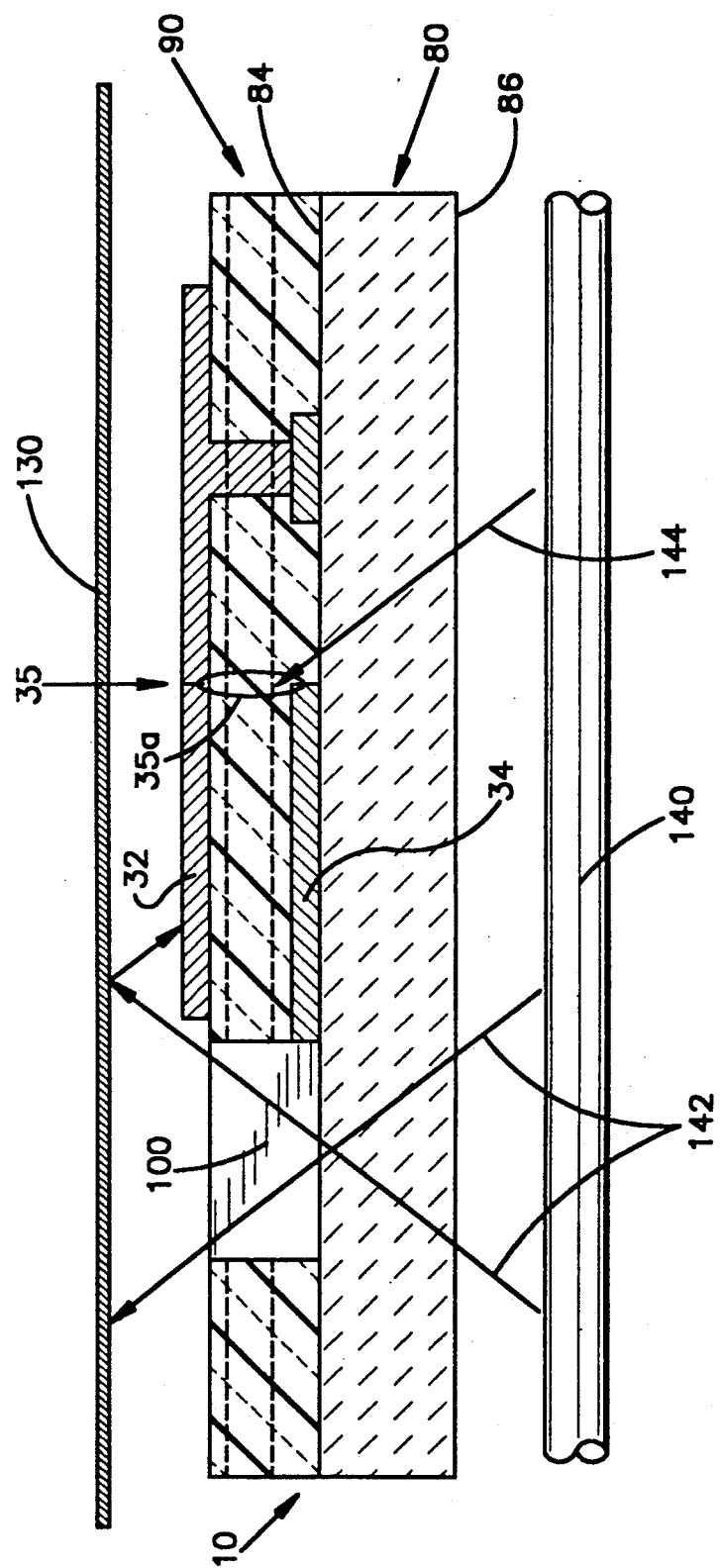
FIG. 7 is an illustration of the array structure of FIG. 4 positioned between an illumination source and the medium or document to be read by the array of the present invention.

Turning to FIG. 7, a portion of the array 10, as discussed earlier with particular regard to FIG. 4, is illustrated in position between a medium such as a document 130 carrying on its underside light contrasting images to be detected. The upper surface of the diodes is adjacent to the underside of the document 130, while the lower and side surfaces of the diode are closer to the upper surface 84 of the substrate 80.

A light source 140 is provided adjacent to the underside 86 of the substrate 80 wherein light (see arrows 142) is transmitted, via the window area 100, through the transparent substrate 80 and impinges (at least a portion thereof) on the document 130. Such light, some of it being absorbed by the document 130, and light contrasting images carried thereon are reflected down into the active region of the adjacent diode to affect the amount of current flow therethrough as discussed earlier. In accordance with the invention, some of the light (see arrow 144) is transmitted through the transparent substrate 80 and penetrates the lower level of the generally light-opaque semiconductor layer 90 so as to impinge directly on a small part or lower end of the side region of the diode (circles area 35a) as discussed earlier with regard to FIG. 4. The penetration of the light into the active region is of a very small proportion relative to the amount of light impinging on the top surface of the diode via optical window 100. However, the light impingement (arrow 144) directly on the diode does establish the earlier discussed discharge or bias current that permits good contrast discrimination, as well as providing a discharge path for non-illuminated diodes, i.e., diodes adjacent to black or dark areas on the document 130. Between scans, the current induced by direct lighting (arrow 144) of the diode allows complete and rapid discharge of the diode so as to avoid residual charges caused by parasitic capacitance. It is to be noted that other means for providing the bias current are contemplated. For example, a small hole through the lower cathode electrode 34 could allow partial illumination of the underside of the diode to provide the bias current.

By use of the diode structure providing the diode discharge bias current as noted, and in cases where minimum inter-diode leakage current is required as discussed with regard to FIGS. 6 and 6A, a simple and efficient array structure has been provided.

It should be evident that this disclosure is by way of example and that various changes may be made by adding, modifying or eliminating details without departing from the scope of the teaching contained in this disclosure. For example, light could be transmitted through the document 130 (see FIG. 7) and then be projected onto the underlying array, the windows 100 being unnecessary, and a separate light source providing the light indicated by arrow 144. Also, the diode array layers could be reversed wherein the anode electrode layer would be formed of light-opaque conductive metal, while the lower cathode layer could be formed of light transparent conductive material, such as indium tin oxide. The invention is therefore not limited to particular details of this disclosure except to the extent that the following claims are necessarily so limited.

What is claimed is:

1. In a device including a substrate supporting an array of photoresponsive semiconductor diode elements spaced closely together, the array being positionable adjacent to a medium presenting light contrasting images to be read by the array, the semiconductor elements being electronically read to provide an electrical signal indicative of the images presented by the medium, each semiconductor element including a portion of a semiconductor material layer sandwiched between an upper electrode and a lower electrode, the improvement wherein at least a portion of the semiconductor material layer between adjacent diodes is removed and replaced by a less electrically conductive material so as to minimize leakage current flow or cross-talk therebetween.

2. A device according to claim 1, wherein said less electrically conductive material also extends over one of said electrodes.

* * * * *